US009553142B2

(12) United States Patent
Chang et al.

(10) Patent No.: US 9,553,142 B2
(45) Date of Patent: Jan. 24, 2017

(54) SEMICONDUCTOR DEVICE HAVING BURIED LAYER

(71) Applicant: Macronix International Co., Ltd., Hsinchu (TW)

(72) Inventors: Yu-Jui Chang, Hsinchu (TW); Cheng-Chi Lin, Toucheng Township (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 14/737,874

(22) Filed: Jun. 12, 2015

(65) Prior Publication Data
US 2016/0365410 A1    Dec. 15, 2016

(51) Int. Cl.
*H01L 29/66* (2006.01)
*H01L 29/06* (2006.01)
*H01L 29/78* (2006.01)
*H01L 29/10* (2006.01)

(52) U.S. Cl.
CPC ....... *H01L 29/0634* (2013.01); *H01L 29/0649* (2013.01); *H01L 29/1095* (2013.01); *H01L 29/7816* (2013.01)

(58) Field of Classification Search
CPC .................................. H01L 29/66681
See application file for complete search history.

(56) References Cited

U.S. PATENT DOCUMENTS

| 2004/0084744 | A1  | 5/2004 | Khemka et al. |
| 2012/0086052 | A1* | 4/2012 | Chen ............ H01L 29/7816 257/288 |
| 2015/0048451 | A1* | 2/2015 | Chan ............ H01L 29/7816 257/343 |

FOREIGN PATENT DOCUMENTS

| TW | 201240085 A1 | 10/2012 |
| TW | 201513348 A  | 4/2015  |

* cited by examiner

*Primary Examiner* — Peniel M Gumedzoe
*Assistant Examiner* — Christopher Johnson
(74) *Attorney, Agent, or Firm* — Finnegan, Henderson, Farabow, Garrett & Dunner LLP (57) ABSTRACT

A semiconductor device includes a substrate having a first conductivity type, a high-voltage well having a second conductivity type and disposed in the substrate, a source region disposed in the high-voltage well, a drain region disposed in the high-voltage well and spaced apart from the source region along a first direction, and a buried layer having the second conductivity type and disposed under an area between the source region and the drain region.

4 Claims, 12 Drawing Sheets

SEMICONDUCTOR DEVICE HAVING BURIED LAYER

FIELD OF THE DISCLOSURE

The present disclosure relates to a semiconductor device and, more particularly, to a semiconductor device having a buried layer.

BACKGROUND

Ultra-high voltage semiconductor devices are widely used in display devices, portable devices, and many other applications. Design goals of the ultra-high voltage semiconductor devices include high breakdown voltage, low specific on-resistance, and high reliability in both room temperature and high temperature environments. However, as the dimensions of ultra-high voltage semiconductor devices scale down, it becomes challenging to achieve these design goals.

SUMMARY

According to an embodiment of the disclosure, a semiconductor device includes a substrate having a first conductivity type, a high-voltage well having a second conductivity type and disposed in the substrate, a source region disposed in the high-voltage well, a drain region disposed in the high-voltage well and spaced apart from the source region along a first direction, and a buried layer having the second conductivity type and disposed under an area between the source region and the drain region.

According to another embodiment of the disclosure, a semiconductor device includes a substrate having a first conductivity type, a high-voltage well having a second conductivity type and disposed in the substrate, a source region disposed in the high-voltage well, a drain region disposed in the high-voltage well and spaced apart from the source region along a first direction, and a plurality of discrete buried regions having the second conductivity type and disposed under an area between the source region and the drain region.

According to still another embodiment of the disclosure, a semiconductor device including a substrate having a first conductivity type, a high-voltage well having a second conductivity type and disposed in the substrate, a source region disposed in the high-voltage well, a drain region disposed in the high-voltage well and spaced apart from the source region along a first direction, and a buried layer having the second conductivity type, disposed in the substrate, and connected to a bottom portion of the high-voltage well, the bottom portion being under an area between the source region and the drain region.

The accompanying drawings, which are incorporated in and constitute a part of this application, illustrate disclosed embodiments and, together with the description, serve to explain the disclosed embodiments.

DETAILED DESCRIPTION

Reference will now be made in detail to the present embodiments, examples of which are illustrated in the accompanying drawings. Wherever possible, the same reference numbers will be used throughout the drawings to refer to the same or like parts.

Figure 1:
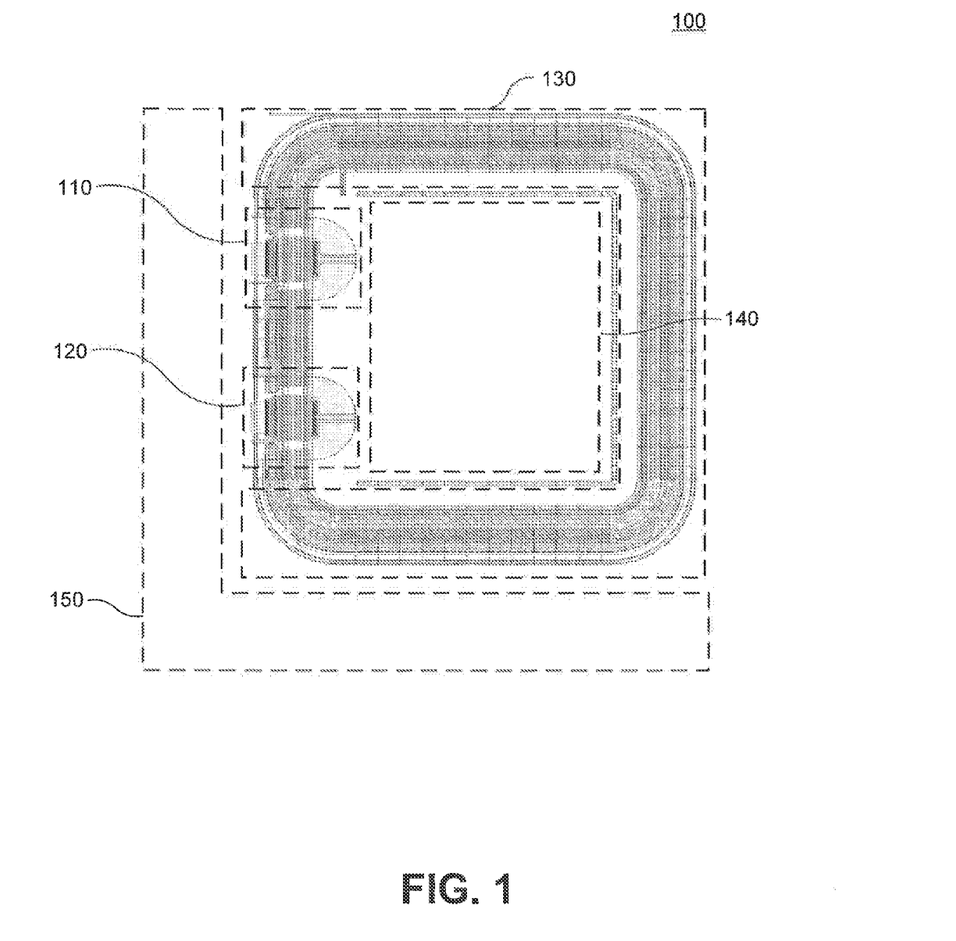
FIG. 1 is a top view of an integrated circuit (IC) having ultra-high voltage metal-oxide-semiconductor (UHV MOS) devices according to an embodiment of the disclosure.

FIG. 1 is a top view of an integrated circuit (IC) 100 having ultra-high voltage metal-oxide-semiconductor (UHV MOS) devices according to an illustrated embodiment. As illustrated in FIG. 1, IC 100 includes two UHV MOS devices 110 and 120, and a parasitic diode 130. A high voltage (HV) area 140 is disposed inside an area surrounded by UHV MOS devices 110 and 120, and parasitic diode 130. A low voltage area 150 is disposed at the left side and the lower side of HV area 140 as viewed in FIG. 1. UHV MOS devices 110 and 120 have similar structures, but can have different operating voltages, such as gate voltages, source voltages, drain voltages, and bulk voltages. Both UHV MOS devices 110 and 120 have relatively high breakdown voltages of higher than 500V. Semiconductor devices such as low-voltage metal-oxide-semiconductor (LVMOS) devices, bipolar junction transistors (BJTs), capacitors, resistors, etc., may be formed in HV area 140. The semiconductor devices formed in HV area 140 are connected to a reference ground voltage of higher than 500V, for high voltage operation, e.g., higher than 500V. Similarly, semiconductor devices such as LVMOS devices, BJTs, capacitors, resistors, etc., may be formed in LV area 150. The semiconductor devices formed in LV area 150 are connected to a ground voltage of about 0V, for low voltage operation, e.g., about 5V or 15V.

Figure 2A:
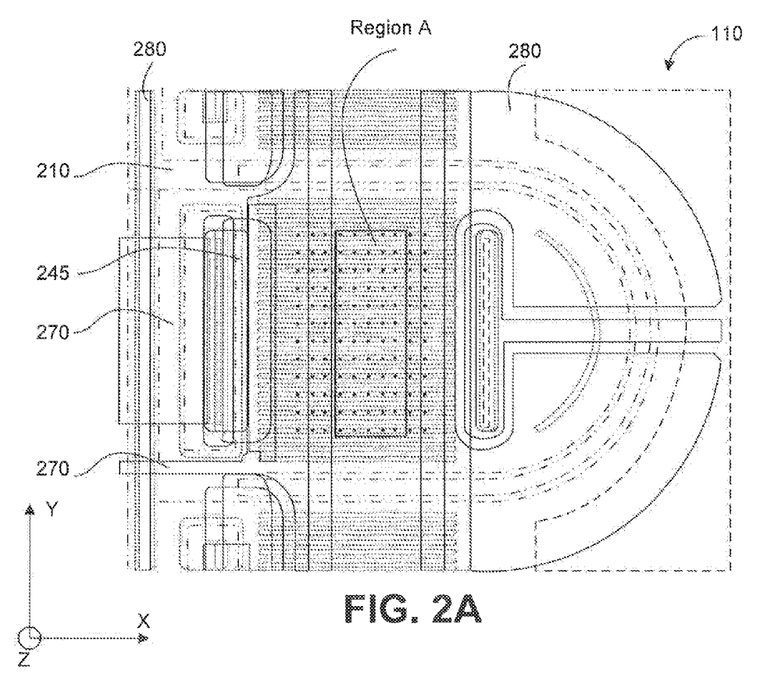
FIG. 2A is an enlarged top view of a UHV MOS device according to an illustrated embodiment.
Figure 2B:
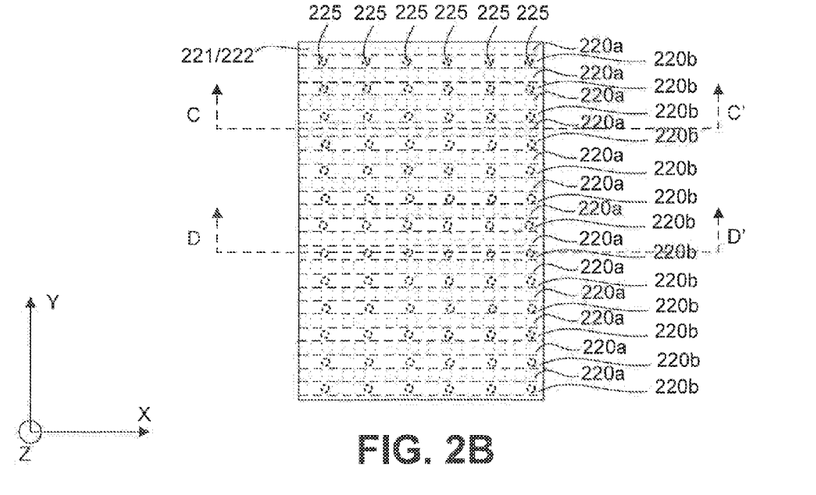
FIG. 2B is a further enlarged top view of region A of the UHV MOS device of FIG. 2A.
Figure 2C:
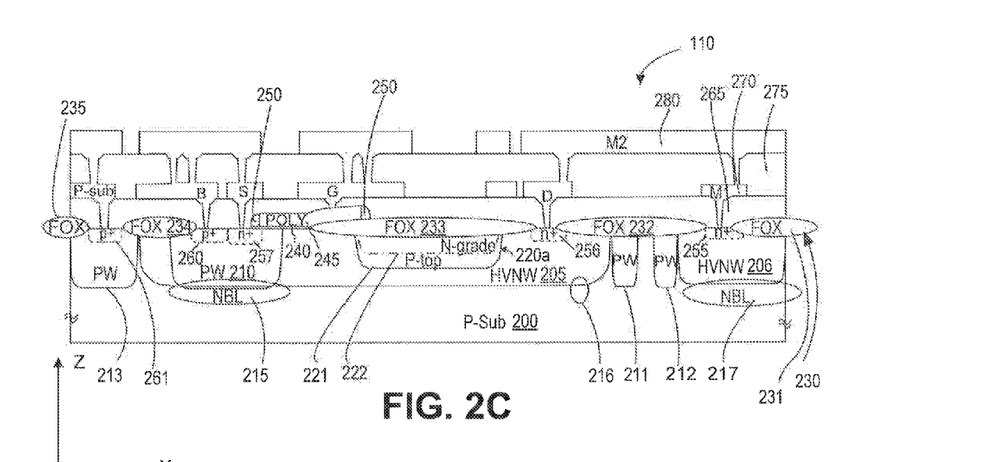
FIG. 2C is a cross-sectional view of the UHV MOS device of FIG. 2A along line C-C' of FIG. 2B.
Figure 2D:
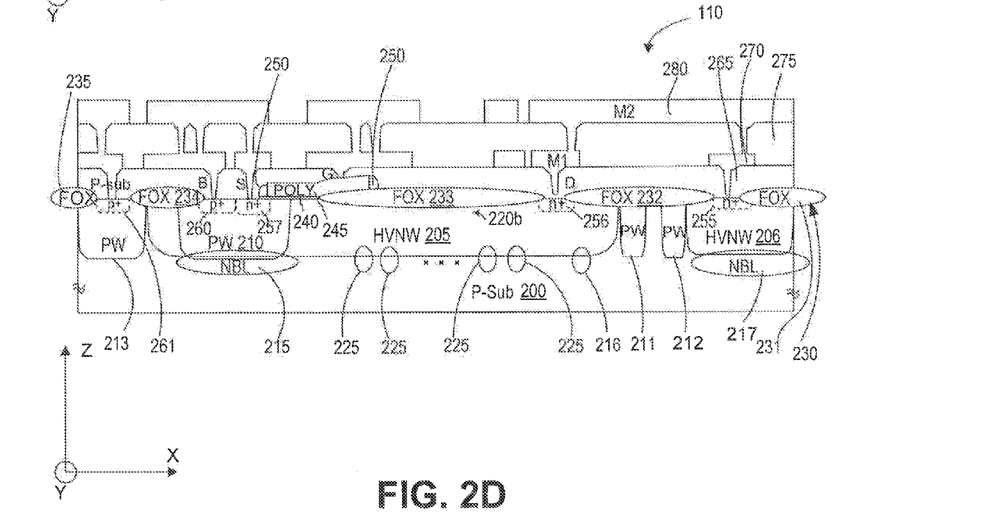
FIG. 2D is a cross-sectional view of the UHV MOS device of FIG. 2A along line D-D' of FIG. 2B.

FIG. 2A is an enlarged top view of UHV MOS device 110 according to an illustrated embodiment. FIG. 2B is a further enlarged top view of region A of UHV MOS device 110 of FIG. 2A. FIG. 2C is a cross-sectional view of UHV MOS device 110 along line C-C' of FIG. 2B. FIG. 2D is a cross-sectional view of UHV MOS device 110 along line D-D' of FIG. 2B. Since the structure of UHV MOS device 120 is similar to the structure of UHV MOS device 110, a separate description of the structure of UHV MOS device 120 is not provided.

With reference to FIGS. 2A-2D, UHV MOS device 110 is provided on a P-type substrate (P-sub) 200. Substrate 200 can be formed of a P-type bulk silicon material, a P-type epitaxial layer, or a P-type silicon-on-insulator (SOI) material. A first high-voltage N-well (HVNW) 205 and a second HVNW 206 are disposed in substrate 200. First HVNW 205 is spaced apart and electrically isolated from second HVNW 206.

A first P-well (PW) 210 is disposed in first HVNW 205 and extends to the bottom of first HVNW 205. A second PW 211 and a third PW 212 are disposed in substrate 200, between first HVNW 205 and second HVNW 206. A fourth PW 213 is disposed in substrate 200, adjacent to a left side of first HVNW 205 opposite to the right side close to second HVNW 206. Second PW 211 is adjacent to a right side of first HVNW 205, and third PW 212 is adjacent to a left side of second HVNW 206. Second PW 211 and third PW 212 are spaced apart from each other to electrically isolate first HVNW 205 from second HVNW 206.

Although UHV MOS device 110 illustrated in FIGS. 2A-2D only includes second PW 211 and third PW 212 to electrically isolate first HVNW 205 from second HVNW 206, UHV MOS device 110 may include more than two PWs disposed between first HVNW 205 and second HVNW 206 to electrically isolate first HVNW 205 from second HVNW 206.

A first N-type buried layer (NBL) 215 is formed in substrate 200, and vertically overlaps (along the Z-direction illustrated in FIGS. 2A-2D) and connects to a bottom portion of first PW 210. A second NBL 216 is formed in substrate 200, and vertically overlaps and connects to a right side bottom portion of first HVNW 205, as viewed in FIGS. 2C and 2D. A third NBL 217 is formed in substrate 200, and vertically overlaps and connects to a bottom portion of second HVNW 206.

A drift region 220 is disposed in first HVNW 205 and spaced apart from first PW 210. Drift region 220 includes a plurality of first sections 220a and second sections 220b alternately arranged (along the Y direction illustrated in FIGS. 2A-2D). Each one of first sections 220a includes a P-top layer 221 and an N-grade layer 222 formed on top of P-top layer 221. Each one of second sections 220b does not include any P-top layer or N-grade layer.

As illustrated in FIGS. 2A, 2B, and 2D, a plurality of discrete $N^+$-buried regions 225 are formed in substrate 200, in an area below drift region 220. The plurality of discrete $N^+$-buried regions 225 are spaced apart from each other along both the Y direction and the X direction. The plurality of discrete $N^+$-buried regions 225 are connected to a bottom portion of first HVNW 205. The plurality of discrete $N^+$-buried regions 225 vertically overlap second sections 220b of drift region 220. The size of $N^+$-buried regions 225 and the space between adjacent $N^+$-buried regions 225 are variables determined by various design considerations. For example and without limitation, in one exemplary embodiment, $N^+$-buried regions 225 each have a diameter of about 1 μm with a space of about 4 μm between adjacent regions 225. The doping concentration of $N^+$-buried regions 225 is determined based on the size and spacing of $N^+$-buried regions 225, the doping concentration of first HVNW 205, and a target breakdown voltage of UHV MOS device 110. For example, $N^+$-buried regions 225 can be doped with an N-type dopant (e.g., arsenic or antimony) at a concentration of about $10^{16}$ to $10^{17}$ atoms/cm$^3$.

An isolation layer 230 is disposed over substrate 200. Isolation layer 230 can be formed of field oxide (FOX). Hereinafter, isolation layer 230 is referred to as FOX layer 230. FOX layer 230 includes first through fifth FOX portions 231-235. First FOX portion 231 covers a right-side portion of second HVNW 206. Second FOX portion 232 covers a right-side edge portion of first HVNW 205, second PW 211, third PW 212, a space between second PW 211 and third PW 212, and a left-side edge portion of second HVNW 206. Third FOX portion 233 covers drift region 220. Fourth FOX portion 234 covers a left-side edge portion of first HVNW 205, a left-side edge portion of first PW 210, and a right-side edge portion of fourth PW 213.

A gate oxide layer 240 is disposed over substrate 200, covering a right-side edge portion of first PW 210, and a space between first PW 210 and third FOX portion 233. A gate layer 245 formed of, e.g., polysilicon (denoted as "poly" in FIGS. 2C and 2D), is disposed over substrate 200, covering gate oxide layer 240 and a left-side portion of third FOX portion 233. Spacers 250 are disposed on side walls of gate layer 245.

A first $N^+$-region 255 is disposed in second HVNW 206 between first FOX portion 231 and second FOX portion 232. A second $N^+$-region 256 is disposed in first HVNW 205 between second FOX portion 232 and third FOX portion 233. Second $N^+$-region 256 constitutes a drain region of UHV MOS device 110. Hereinafter, second $N^+$-region 256 is referred to as a drain region 256. A third $N^+$-region 257 is disposed in the right-side portion of first PW 210 adjacent to a left-side edge portion of gate oxide layer 240. Third $N^+$-region 257 constitutes a source region of UHV MOS device 110. Hereinafter, third $N^+$-region 257 is referred to as a source region 257.

A first $P^+$-region 260 is disposed in a left-side portion of first PW 210, adjacent to a left-side edge portion of third $N^+$-region 257. First $P^+$-region 260 constitutes a bulk (B) region of UHV MOS device 110. Hereinafter, first $P^+$-region 260 is referred to as a bulk region 260. A second $P^+$-region 261 is disposed in fourth PW 213, between fourth FOX portion 234 and fifth FOX portion 235. Second $P^+$-region 261 provides a connection to substrate 200. Hereinafter, second $P^+$-region 261 is referred to as a P-sub region 261.

An interlayer dielectric (ILD) layer 265 is disposed over substrate 200 and has through holes to enable respective contacts with first $N^+$-region 255, drain region 256, gate layer 245, source region 257, bulk region 260, and P-sub region 261. A first metal (M1) layer 270 is disposed over ILD layer 265 and includes electrically isolated portions respectively connected to first $N^+$-region 255, drain region 256, gate layer 245, source region 257, bulk region 260, and P-sub region 261.

An inter-metal dielectric (IMD) layer 275 is disposed over M1 layer 270 and has through holes (so-called "vias") respectively corresponding to the electrically isolated portions of M1 layer 270. A second metal (M2) layer 280 is disposed over IMD layer 275 and includes electrically isolated portions respectively connected to the electrically isolated portions of M1 layer 270.

Figure 3:
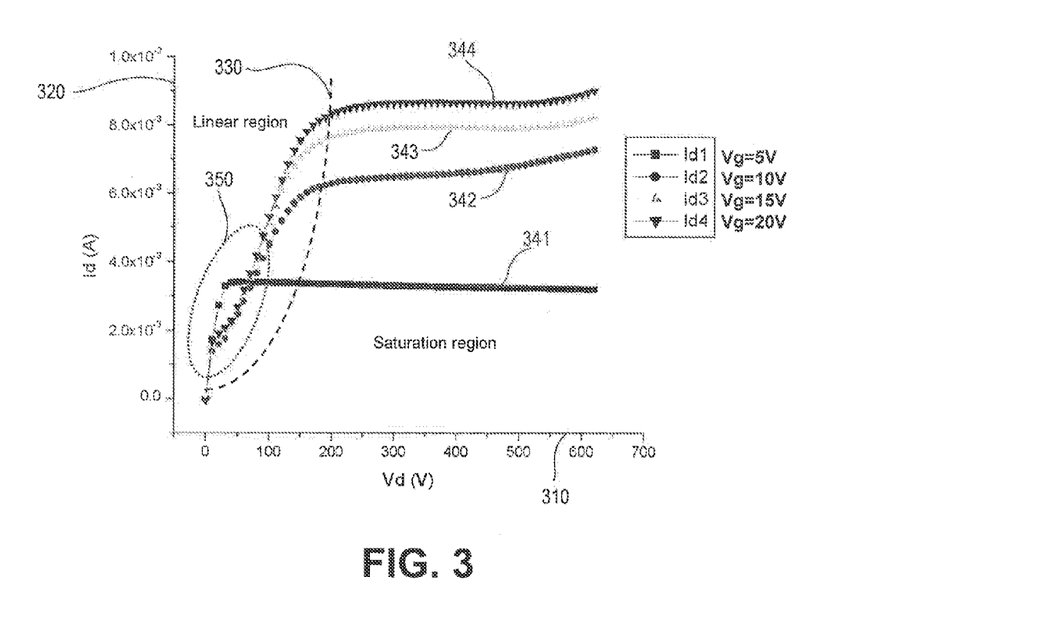
FIG. 3 is a graph showing drain-source current-voltage characteristics of a device of a comparative example.

FIG. 3 is a graph showing drain-source current-voltage characteristics of a UHV MOS device constructed as a comparative example. The device of the comparative example has a structure similar to that of UHV MOS device 110 illustrated in FIGS. 2A-2D, except that the device of the comparative example does not include the plurality of discrete N$^+$-buried regions 225. In the graph of FIG. 3, an abscissa 310 represents a drain-source voltage Vd in volts V (i.e., the voltage applied between a drain region and a source region of the device), and an ordinate 320 represents a drain-source current Id in amperes A (i.e., the current flowing between the drain region and the source region of the device). Dotted line 330 represents a border between a linear region and a saturation region. That is, the linear region is located at the left side of line 330, and the saturation region is located at the right side of line 330. During the measurements of a drain-source current Id, the drain-source voltage Vd varies from 0 to 600V. Curve 341 represents the drain-source current Id measured with a constant gate-source voltage Vg (i.e., the voltage applied between a gate layer and the source region of the device) of 5V. Curve 342 represents the drain-source current Id measured with a constant gate-source voltage Vg of 10V. Curve 343 represents the drain-source current Id measured with a constant gate-source voltage Vg of 15V. Curve 344 represents the drain-source current Id measured with a constant gate-source voltage Vg of 20V.

Figure 4:
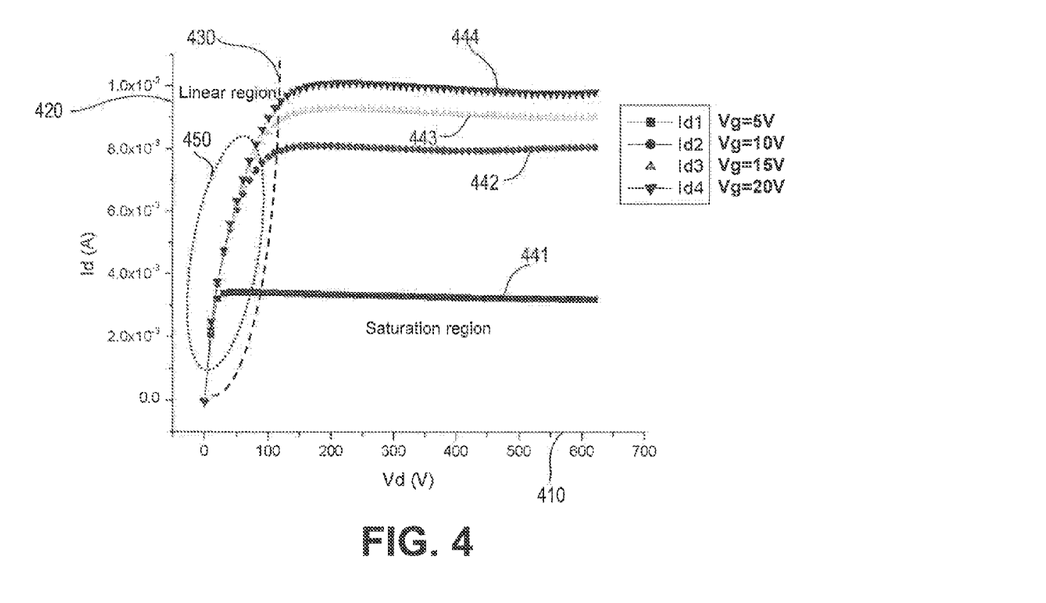
FIG. 4 is a graph showing drain-source current-voltage characteristics of the UHV MOS device of FIG. 2A, according to an illustrated embodiment.

FIG. 4 is a graph showing drain-source current-voltage characteristics of UHV MOS device 110, constructed according to an illustrated embodiment. In the graph of FIG. 4, an abscissa 410 represents a drain-source voltage Vd in volts V (i.e., the voltage applied between drain region 256 and source region 257), and an ordinate 420 represents a drain-source current Id in amperes A (i.e., the current flowing between drain region 256 and source region 257). Dotted line 430 represents a border between a linear region and a saturation region. That is, the linear region is located at the left side of line 430, and the saturation region is located at the right side of line 430. During the measurements of a drain-source current Id, the drain-source voltage Vd varies from 0 to 600V. Curve 441 represents the drain-source current Id measured with a constant gate-source voltage Vg of 5V. Curve 442 represents the drain-source current Id measured with a constant gate-source voltage Vg of 10V. Curve 443 represents the drain-source current Id measured with a constant gate-source voltage Vg of 15V. Curve 444 represents the drain-source current Id measured with a constant gate-source voltage Vg of 20V.

According to FIG. 3, when the device of the comparative example operates in the linear region, the drain-source current-voltage curve (as indicated by curve 341 in a region circled by dotted line 350) with the gate-source voltage Vg of 5V is smooth, while the drain-source current-voltage curves with gate-source voltages Vg of 10V, 15V, and 20V (as indicated by curves 342, 343, and 344 in the region circled by dotted line 350) are obstructed. That is, the drain-source currents Id with gate-source voltages Vg of 10V, 15V, and 20V are lower than the drain source current Id with the gate-source voltage Vg of 5V when the drain-source voltage Vd is lower than about 60V. In contrast, according to FIG. 4, when UHV MOS device 110 of the embodiment of the disclosure operates in the linear region, the drain-source current-voltage curves with gate-source voltages Vg of 5V, 10V, 15V, and 20V (as indicated by curves 441, 442, 443, and 444 in a region circled by dotted line 450) are smooth. Therefore, the drain-source current-voltage characteristic of UHV MOS device 110 of the embodiment of the disclosure is improved compared to the drain-source current-voltage characteristic of the device of the comparative example. This is because electrons transport more smoothly between drain region 256 and source region 257, in UHV MOS Device 110 of the embodiment of the disclosure, due to the presence of the plurality of discrete N$^+$-buried regions 225.

Table 1 below summarizes electrical property values of the device constructed as the comparative example and UHV MOS device 110 constructed according to an embodiment of the disclosure.

|  | Comparative Example | UHV MOS Device 110 |
|---|---|---|
| Vt (V) | 1.32 | 1.33 |
| Idlin (μA) | 338 | 379 |
| BV (V) | 820 | 810 |

In Table 1, Vt represents the threshold voltage of each one of the device of the comparative example and UHV MOS device 110. The threshold voltage Vt is determined by using a maximum transconductance (max gm) method. According to the max gm method, the threshold voltage Vt of a device corresponds to a gate voltage axis intercept of a linear extrapolation of transconductance versus gate-source voltage (gm-Vg) characteristics of the device at its maximum first derivative (slope) point, where the transconductance gm is the ratio of a drain-source current Id variation with a gate-source voltage Vg variation while keeping a drain-source voltage Vd constant, i.e., $$g_m = \frac{\partial Id}{\partial Vg}.$$

In Table 1, Idlin represents a linear region drain-source current (i.e., the drain source current at the linear region) of each one of the device of the comparative example and UHV MOS device 110. The linear region drain-source current Idlin is determined as the drain-source current Id measured when the drain-source voltage Vd is 1V and the gate-source voltage Vg is 15V.

In Table 1, BV represents an off breakdown voltage of each one of the device of the comparative example and UHV MOS device 110. The off breakdown voltage BV is determined as the value of the drain-source voltage Vd at which the drain-source current Id reaches 1 μA when the drain-source voltage Vd increases from 0V and the gate-source voltage Vg is 0V.

According to Table 1, the device of the comparative example and UHV MOS device 110 of the embodiment of the disclosure have similar threshold voltages Vt and off breakdown voltages BV. However, the linear region drain-source current Idlin of UHV MOS device 110 of the embodiment of the disclosure is higher than that of the device of the comparative example. Therefore, the on-state resistance of UHV MOS device 110 is lower than that of the device of the comparative example.

While the embodiment described above is directed to an N-type UHV MOS device 110 shown in FIGS. 2A-2D, those skilled in the art will now appreciate that the disclosed concepts are equally applicable to a P-type UHV MOS device in which all of the elements have conductivity types opposite to those of N-type UHV MOS device 110.

While isolation layer 230 of UHV MOS device 110 in the embodiment described above is made of field oxide, isolation layer 230 can be made of other suitable dielectric insulating structures, such as a shallow trench isolation (STI) structure.

While UHV MOS device 110 of the embodiment described above has two metal layers, i.e., M1 layer 270 and M2 layer 280, those skilled in the art will now appreciate that the disclosed concepts are equally applicable to UHV MOS devices having only one metal layer, or having more than two metal layers.

While discrete $N^+$-buried regions 225 in UHV MOS device 110 of the embodiment described above vertically overlap second sections 220b of drift region 220, the discrete $N^+$-buried regions can vertically overlap first sections 220a of drift region 220.

Figure 5A:
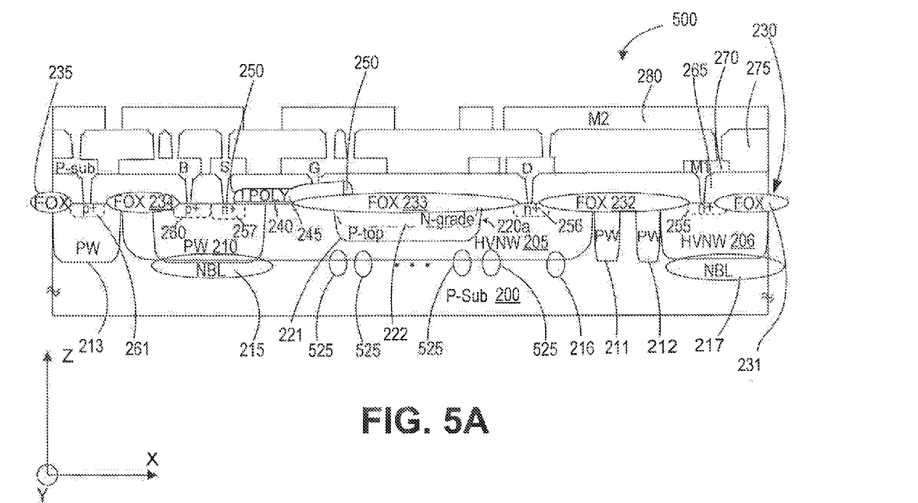
FIG. 5A illustrates a first cross section of a UHV MOS device, according to an illustrated embodiment.
Figure 5B:
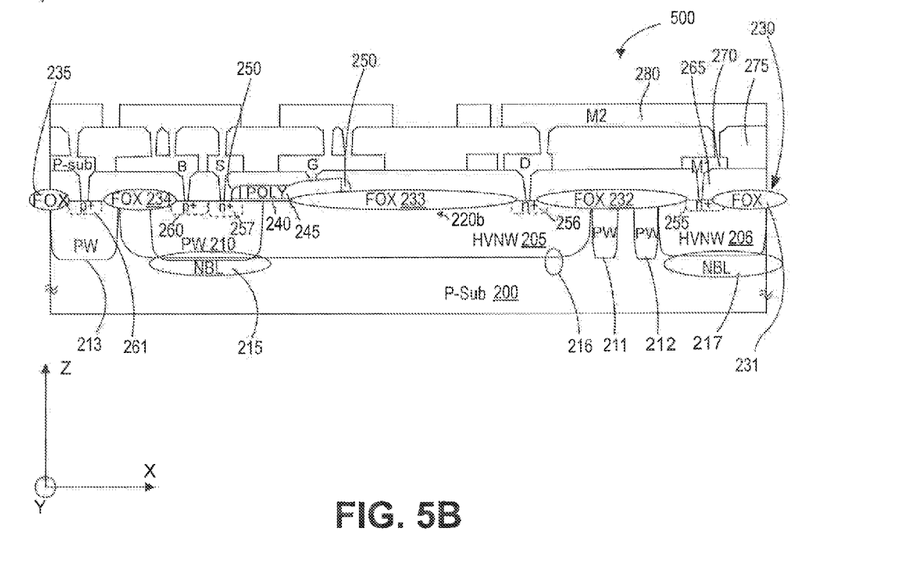
FIG. 5B illustrates a second cross section of the UHV MOS device of FIG. 5A, according to the illustrated embodiment.

FIG. 5A illustrates a first cross section of a UHV MOS device 500, according to an illustrated embodiment. FIG. 5B illustrates a second cross section of UHV MOS device 500, according to the illustrated embodiment. The first cross section and the second cross section are alternately arranged along the Y direction illustrated in FIGS. 5A and 5B. According to FIGS. 5A and 5B, UHV MOS device 500 has a structure similar to that of UHV MOS device 110, except that UHV MOS device 500 includes a plurality of discrete $N^+$-buried regions 525 that vertically overlap first sections 220a of drift region 220. Similar to discrete $N^+$-buried regions 225 in UHV MOS device 110, the plurality of discrete $N^+$-buried regions 525 in UHV MOS device 500 are spaced apart from each other along both the Y direction and the X direction of UHV MOS device 500. The plurality of discrete $N^+$-buried regions 525 are connected to a bottom portion of first HVNW 205.

While the embodiment described above is directed to UHV MOS device 500 shown in FIGS. 5A and 5B, those skilled in the art will now appreciate that the disclosed concepts are equally applicable to other semiconductor devices.

Figure 6A:
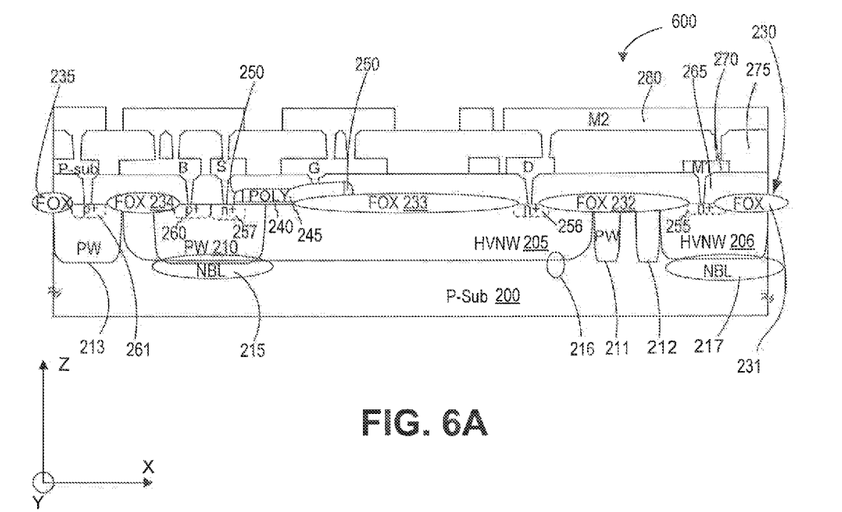
FIG. 6A illustrates a first cross section of a semiconductor device, according to an illustrated embodiment.
Figure 6B:
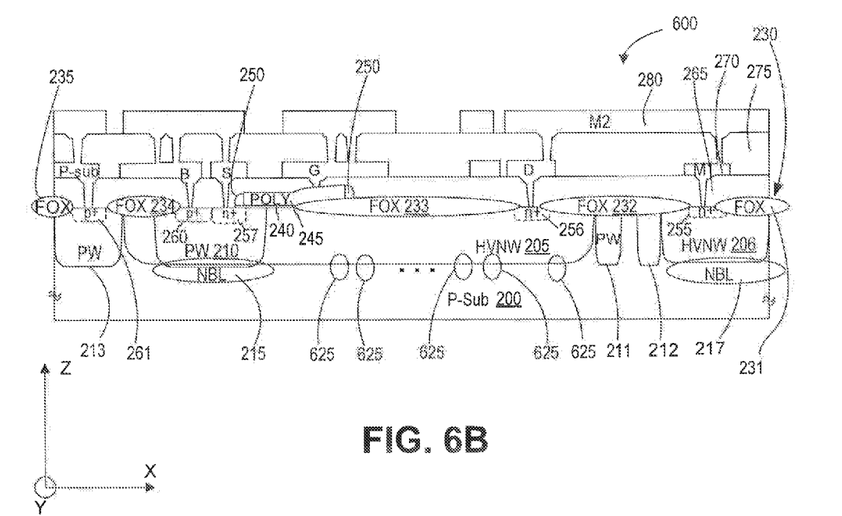
FIG. 6B illustrates a second cross section of the semiconductor device of FIG. 6A, according to the illustrated embodiment.

FIG. 6A illustrates a first cross section of a semiconductor device 600, according to an illustrated embodiment. FIG. 6B illustrates a second cross section of device 600, according to the illustrated embodiment. The first cross section and the second cross section are alternately arranged along the Y direction illustrated in FIGS. 6A and 6B. According to FIGS. 6A and 6B, device 600 has a structure similar to that of UHV MOS device 110, except that device 600 does not include drift region 220. Device 600 include a plurality of discrete $N^+$-buried regions 625 that are spaced apart from each other along both the Y direction and the X direction. Thus, the plurality of discrete $N^+$-buried regions 625 are only shown in FIG. 6B, which illustrates the second cross section of device 600. The plurality of discrete $N^+$-buried regions 625 are connected to a bottom portion of first HVNW 205.

While discrete $N^+$-buried regions 625 in UHV MOS device 600 of the embodiment described above are disposed in substrate 200 and connected to the bottom portion of first HVNW 205, the discrete $N^+$-buried regions can be disposed in first HVNW 205.

Figure 7A:
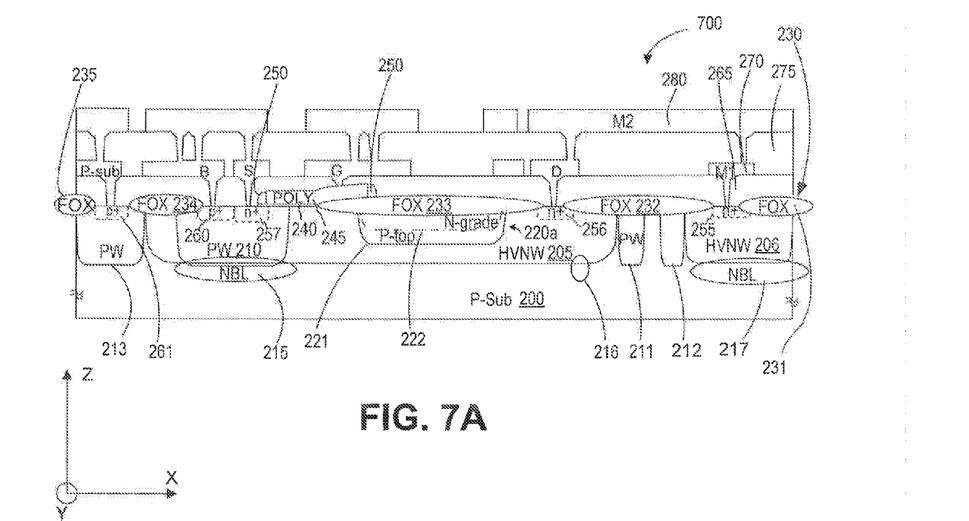
FIG. 7A illustrates a first cross section of a UHV MOS device, according to an illustrated embodiment.
Figure 7B:
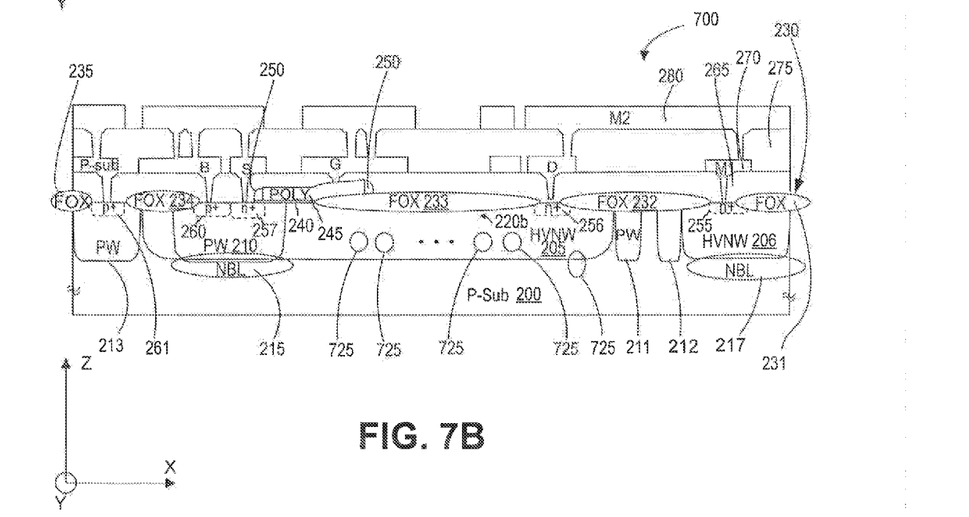
FIG. 7B illustrates a second cross section of the UHV MOS device of FIG. 7A, according to the illustrated embodiment.

FIG. 7A illustrates a first cross section of a UHV MOS device 700, according to an illustrated embodiment. FIG. 7B illustrates a second cross section of UHV MOS device 700, according to the illustrated embodiment. The first cross section and the second cross section are alternately arranged along the Y direction illustrated in FIGS. 7A and 7B. According to FIGS. 7A and 7B, UHV MOS device 700 has a structure similar to that of UHV MOS device 110, except that UHV MOS device 700 includes a plurality of discrete $N^+$-buried regions 725 in first HVNW 205, in an area under drift region 220. The plurality of discrete $N^+$-buried regions 725 vertically overlap second sections 220b of drift region 220.

While the plurality of discrete $N^+$-buried regions 725 in UHV MOS device 700 of the embodiment described above are spaced apart from each other along both the Y direction and the X direction, the discrete $N^+$-buried layer regions can be spaced apart from each other only along the Y direction.

Figure 8A:
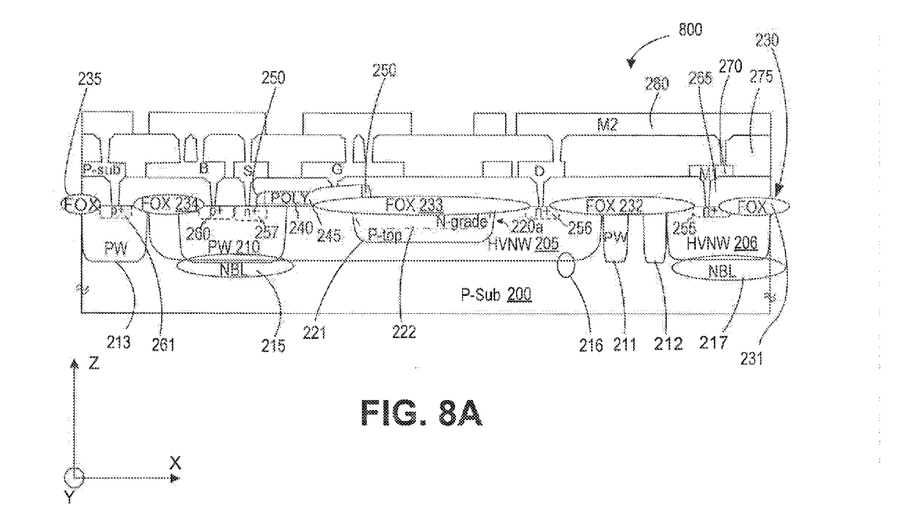
FIG. 8A illustrates a first cross section of a UHV MOS device, according to an illustrated embodiment.
Figure 8B:
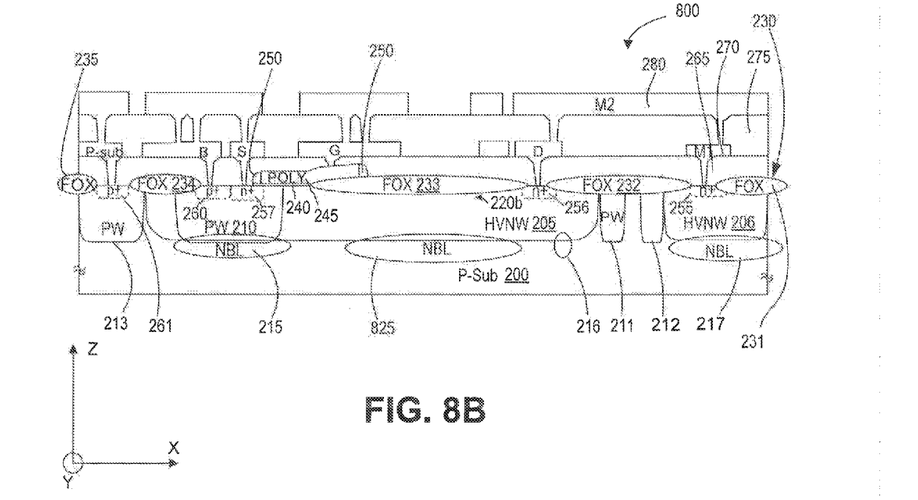
FIG. 8B illustrates a second cross section of the UHV MOS device of FIG. 8A, according to the illustrated embodiment.

FIG. 8A illustrates a first cross section of a UHV MOS device 800, according to an illustrated embodiment. FIG. 8B illustrates a second cross section of UHV MOS device 800, according to the illustrated embodiment. The first cross section and the second cross section are alternately arranged along the Y direction as illustrated in FIGS. 8A and 8B. According to FIGS. 8A and 8B, UHV MOS device 800 has a structure similar to that of UHV MOS device 110, except that UHV MOS device 800 includes a plurality of discrete $N^+$-buried regions 825 in substrate 200 that are spaced apart from each other along the Y direction. Each one of the plurality of discrete $N^+$-buried regions 825 extends along the X direction, and vertically overlap a corresponding second section 220b of drift region 220. The plurality of discrete $N^+$-buried regions 825 are disposed in an area below drift region 220, and are connected to the bottom portion of first HVNW 205.

While P-top layer 221 and N-grade layer 222 in UHV MOS device 800 of the embodiment described above extend along the X direction, a UHV MOS device can include a plurality of discrete P-top layers and a plurality of discrete N-grade layers spaced apart from each other along the X direction.

Figure 9A:
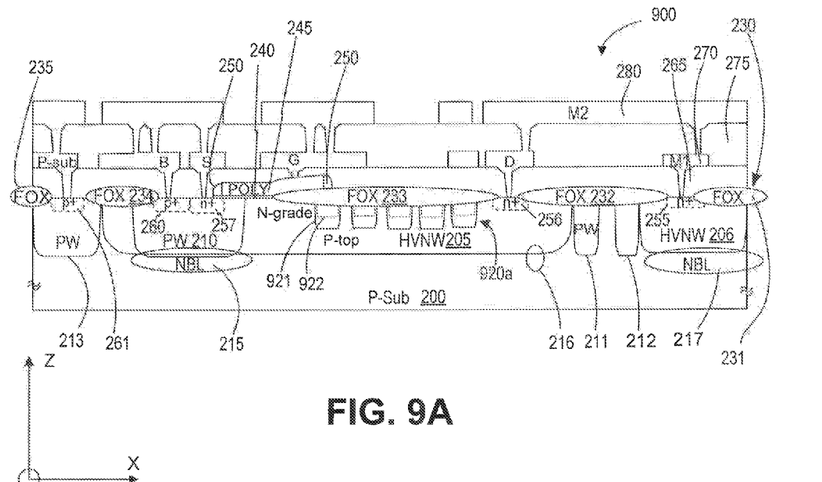
FIG. 9A illustrates a first cross section of a UHV MOS device, according to an illustrated embodiment.
Figure 9B:
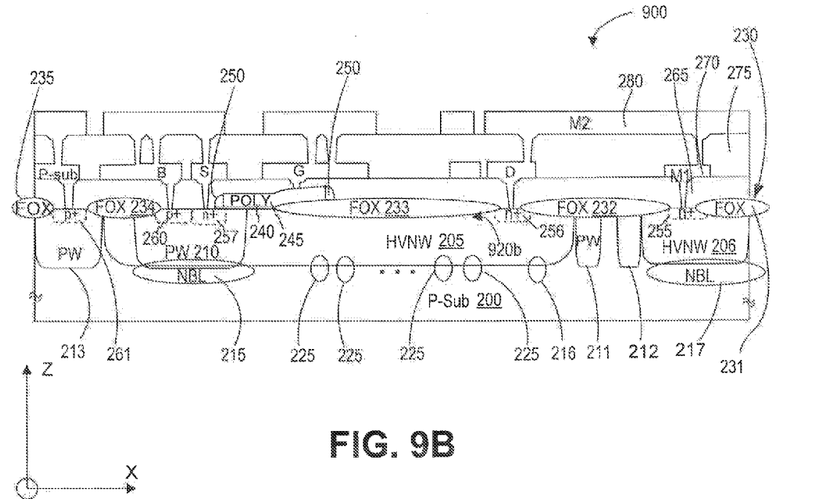
FIG. 9B illustrates a second cross section of the UHV MOS device of FIG. 9A, according to the illustrated embodiment.

FIG. 9A illustrates a first cross section of a UHV MOS device 900, according to an illustrated embodiment. FIG. 9B is a second cross section of UHV MOS device 900, according to the illustrated embodiment. The first cross section and the second cross section are alternately arranged along the Y direction as illustrated in FIGS. 9A and 9B. According to FIGS. 9A and 9B, UHV MOS device 900 has a structure similar to that of UHV MOS device 110, except that each one of first sections 920a of the drift region of UHV MOS device 900 includes a plurality of discrete P-top layers 921 spaced apart from each other along the X direction illustrated in FIGS. 9A and 9B, and a plurality of discrete N-grade layers 922 disposed on top of corresponding ones of discrete P-top layers 921. Each one of second sections 920b does not include any P-top layer or N-grade layer.

Those skilled in the art will also appreciate that the disclosed concepts are applicable to other semiconductor devices, such as insulated-gate bipolar transistor (IGBT) devices, high-voltage diodes, and junction field-effect transistors (JFET).

Figure 10:
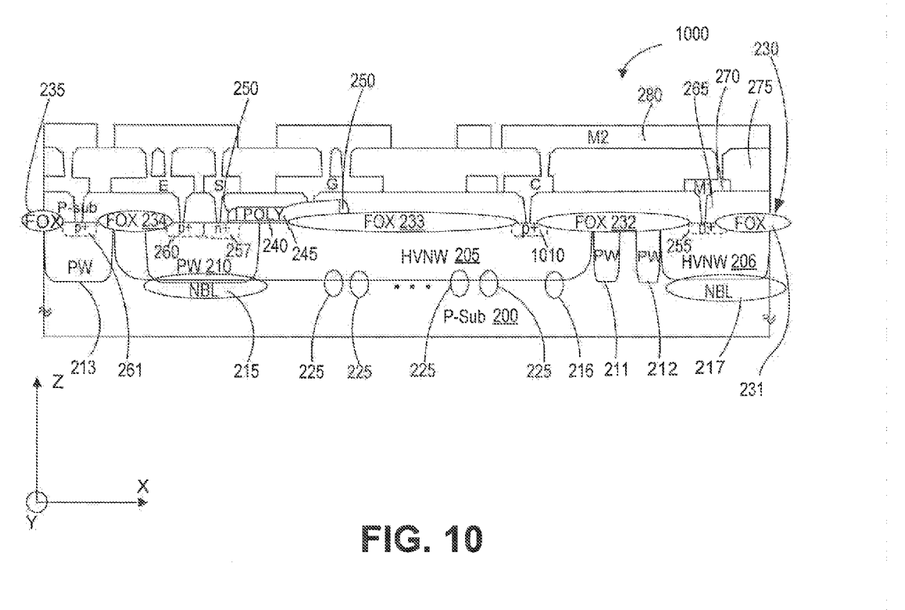
FIG. 10 is a cross-sectional view of an insulated gate bipolar transistor, according to an illustrated embodiment.

FIG. 10 is a cross sectional view of an insulated gate bipolar transistor (IGBT) 1000, according to an illustrated embodiment. IGBT 1000 has a structure similar to that of UHV MOS device 110, except that second $N^+$-region 256 of UHV MOS device 110 is replaced with a $P^+$-region 1010. In IGBT 1000 illustrated in FIG. 10, $P^+$-region 1010 constitutes a collector region, third $N^+$-region 257 constitutes a source region, and first $P^+$-region 260 constitutes an emitter region.

Figure 11:
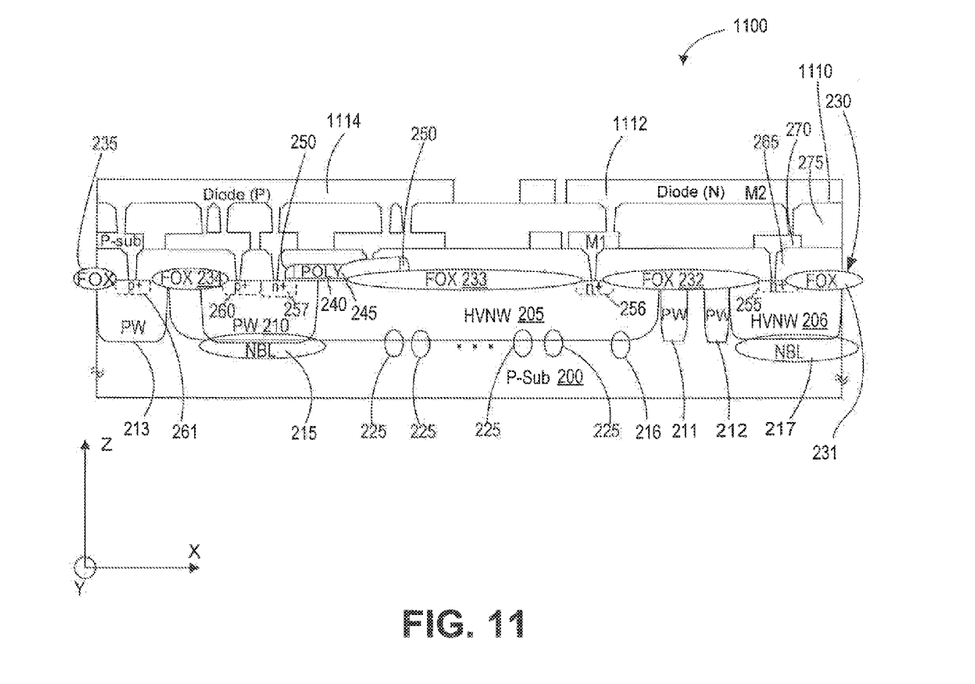
FIG. 11 is a cross-sectional view of a high voltage diode, according to an illustrated embodiment.

FIG. 11 is a cross sectional view of a high-voltage (HV) diode 1100, according to an illustrated embodiment. HV diode 1100 has a structure similar to that of UHV MOS device 110, except that a second metal (M2) layer 1110 includes a first M2 portion 1112 that conductively contacts first N+-region 255 and drain region 256, and a second M2 portion 1114 that conductively contacts gate layer 245, source region 257, and P-sub region 261. First M2 portion 1112 constitutes an N-type terminal of HV diode 1100, and second M2 portion 1114 constitutes a P-type terminal of HV diode 1100.

Figure 12:
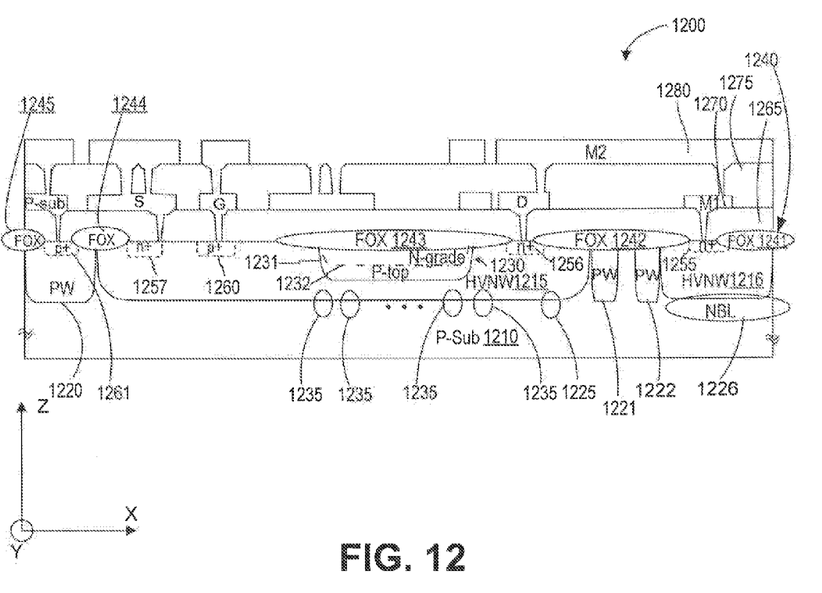
FIG. 12 is a cross-sectional view of a junction field-effect transistor, according to an illustrated embodiment.

FIG. 12 is a cross sectional view of a JFET 1200, according to an illustrated embodiment. JFET 1200 is provided on a P-type substrate (P-sub) 1210. A first high-voltage N-well (HVNW) 1215 and a second HVNW 1216 are disposed in substrate 1210, and spaced apart from each other.

A first PW 1220 is disposed in substrate 1210, adjacent to a left side of first HVNW 1215. A second PW 1221 and a third PW 1222 are disposed in substrate 1210, between first HVNW 1215 and second HVNW 1216. Second PW 1221 is adjacent to a right side of first HVNW 1215, and third PW 1222 is adjacent to a left side of second HVNW 1216. Second PW 1221 and third PW 1222 are spaced apart from each other to electrically isolate first HVNW 1215 from second HVNW 1216.

A NBL 1225 is formed in substrate 1210. NBL 1225 vertically overlaps and connects to a right side bottom portion of first HVNW 1215.

A drift region 1230 is disposed in first HVNW 1215. Drift region 1230 includes a plurality of first sections and second sections alternately arranged along the Y direction illustrated in FIG. 12. Each one of the first sections includes a P-top layer 1231 and an N-grade layer 1232 formed on top of P-top layer 1231. Each one of the second sections does not include any P-top layer or N-grade layer. Although FIG. 12 only illustrates the cross sectional view of one of the first sections, the cross sectional view of the second section is similar to that of the first section, except that first HVNW 1215 forms the entirety of drift region 1230 in the cross sectional view of the second section.

A plurality of discrete N+-buried regions 1235 are formed in substrate 1210, in an area below drift region 1230. The plurality of discrete N+-buried regions 1235 are spaced apart from each other along both the Y direction and the X direction illustrated in FIG. 12. The plurality of discrete N+-buried regions 1235 are connected to a bottom portion of first HVNW 1215, and vertically overlap the first sections of drift region 1230.

A FOX layer 1240 is disposed over substrate 1210. FOX layer 1240 includes first through fifth FOX portions 1241-1245. First FOX portion 1241 covers a right-side portion of second HVNW 1216. Second FOX portion 1242 covers a right-side edge portion of first HVNW 1215, second PW 1221, third PW 1222, a space between second PW 1221 and third PW 1222, and a left-side edge portion of second HVNW 1216. Third FOX portion 1243 covers drift region 1230. Fourth FOX portion 1244 covers a left-side edge portion of first HVNW 1215 and a right-side edge portion of first PW 1220.

A first N+-region 1255 is disposed in second HVNW 1216 between first FOX portion 1241 and second FOX portion 1242. A second N+-region 1256 is disposed in first HVNW 1215 between second FOX portion 1242 and third FOX portion 1243. Second N+-region 1256 constitutes a drain region of JFET 1200. Hereinafter, second N+-region 1256 is referred to as a drain region 1256. A third N+-region 1257 is disposed in first HVNW 1215, adjacent to a right-side edge portion of fourth FOX portion 1244. Third N+-region 1257 constitutes a source region of JFET 1200. Hereinafter, third N+-region 1257 is referred to as a source region 1257.

A first P+-region 1260 is disposed in first HVNW 1215, between third N+-region 1257 and drift region 1230. First P+-region 1260 is spaced apart from both source 1257 and drift region 1230, and constitutes a gate region of JFET 1200. Hereinafter, first P+-region 1260 is referred to as a gate region 1260. A second P+-region 1261 is disposed in first PW 1220, between fourth FOX portion 1244 and fifth FOX portion 1245. Second P+-region 1261 provides a connection to substrate 1210. Hereinafter, second P+-region 1261 is referred to as a P-sub region 1261.

An interlayer dielectric (ILD) layer 1265 is disposed over substrate 1210 and has through holes to enable respective contacts with first N+-region 1255, drain region 1256, gate region 160, source region 1257, and P-sub region 1261. A first metal (M1) layer 1270 is disposed over ILD layer 1265 and includes electrically isolated portions respectively connected to first N+-region 1255, drain region 1256, gate region 160, source region 1257, and P-sub region 1261.

An inter-metal dielectric (IMD) layer 1275 is disposed over M1 layer 1270 and has through holes (so-called "vias") respectively corresponding to the electrically isolated portions of M1 layer 1270. A second metal (M2) layer 1280 is disposed over IMD layer 1275 and includes electrically isolated portions respectively connected to the electrically isolated portions of M1 layer 1270.

The semiconductor devices in the embodiments described above can be applied in various applications such as, for example, light emitting diode (LED) lighting, energy saving lamps, ballast applications, and motor driver applications.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A semiconductor device, comprising:
   a substrate having a first conductivity type;
   a high-voltage well having a second conductivity type and disposed in the substrate;
   a source region disposed in the high-voltage well;
   a drain region disposed in the high-voltage well and spaced apart from the source region along a first direction; and
   a plurality of discrete buried regions having the second conductivity type and disposed under an area between the source region and the drain region,
   wherein the plurality of discrete buried regions are spaced apart from each other along a second direction orthogonal to the first direction.

2. The semiconductor device of claim 1, wherein the plurality of discrete buried regions are spaced apart from each other along the first direction.

3. A semiconductor device, comprising;
   a substrate having a first conductivity type;
   a high-voltage well having a second conductivity type and disposed in the substrate;
   a source region disposed in the high-voltage well;
   a drain region disposed in the high-voltage well and spaced apart from the source region along a first direction; and
   a buried layer having the second conductivity type, disposed in the substrate, and connected to a bottom portion of the high-voltage well, the bottom portion being under an area between the source region and the drain region, wherein the buried layer includes a plurality of discrete buried regions spaced apart from each other along a second direction orthogonal to the first direction.

4. The semiconductor device of claim 3, wherein the plurality of discrete buried regions are spaced apart from each other along the first direction.

* * * * *